(12) United States Patent
Kim

(10) Patent No.: US 8,119,515 B2
(45) Date of Patent: Feb. 21, 2012

(54) BONDING PAD FOR ANTI-PEELING PROPERTY AND METHOD FOR FABRICATING THE SAME

(75) Inventor: Jeong-Soo Kim, Kyoungki-do (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 83 days.

(21) Appl. No.: 12/164,773

(22) Filed: Jun. 30, 2008

(65) Prior Publication Data

US 2009/0152727 A1    Jun. 18, 2009

(30) Foreign Application Priority Data

Dec. 18, 2007  (KR) .................. 10-2007-0133331

(51) Int. Cl.
*H01L 21/44* (2006.01)
(52) U.S. Cl. .... 438/612; 438/652; 438/654; 257/E23.02
(58) Field of Classification Search .................. 438/612, 438/652, 654; 257/E23.02
See application file for complete search history.

(56) References Cited

U.S. PATENT DOCUMENTS

| | | | |
|---|---|---|---|
| 6,380,087 B1 * | 4/2002 | Gupta et al. | 438/692 |
| 2001/0051426 A1 * | 12/2001 | Pozder et al. | 438/666 |
| 2002/0006717 A1 * | 1/2002 | Yamaha | 438/612 |
| 2002/0197458 A1 * | 12/2002 | Peng et al. | 428/209 |
| 2003/0054626 A1 * | 3/2003 | Kobayashi et al. | 438/612 |
| 2004/0195642 A1 * | 10/2004 | Angell et al. | 257/459 |
| 2005/0014356 A1 * | 1/2005 | Pozder et al. | 438/614 |
| 2005/0073058 A1 * | 4/2005 | Kuo et al. | 257/786 |
| 2005/0121803 A1 * | 6/2005 | Angell et al. | 257/779 |
| 2005/0127496 A1 * | 6/2005 | Kwon et al. | 257/700 |
| 2005/0146042 A1 * | 7/2005 | Yamaha | 257/758 |
| 2007/0161222 A1 * | 7/2007 | Kim | 438/612 |

FOREIGN PATENT DOCUMENTS

| | | | |
|---|---|---|---|
| JP | 2004-158679 | | 3/2004 |
| KR | 10-2002-0051534 | | 6/2002 |
| KR | 1020020051534 | * | 6/2002 |
| KR | 10-2002-0053947 | | 7/2002 |

OTHER PUBLICATIONS

Office Action dated May 29, 2009, for Korean application No. 10-2007-0133331.
Korean Notice of Allowance for Korean patent application No. 10-2007-0133331.

* cited by examiner

*Primary Examiner* — Kevin Parendo
(74) *Attorney, Agent, or Firm* — Lowe Hauptman Ham & Berner LLP

(57) ABSTRACT

A bonding pad includes a conductive layer formed over an insulation layer, and a dummy pattern penetrating the insulation layer and stuck in the conductive layer, wherein a bonding process is performed.

18 Claims, 6 Drawing Sheets

BONDING PAD FOR ANTI-PEELING PROPERTY AND METHOD FOR FABRICATING THE SAME

CROSS-REFERENCE TO RELATED APPLICATIONS

The present invention claims priority of Korean patent application number 2007-0133331, filed on Dec. 18, 2007, the which is incorporated by reference in its entirety.

BACKGROUND OF THE INVENTION

The present invention relates to a method for fabricating a semiconductor device, and more particularly, to a bonding pad for preventing a pad peeling and method for fabricating the same.

Generally, in a process for fabricating semiconductor devices, particularly in a package process (in a wire bonding process), a metal pad of a bonding pad unit disposed in a chip is electrically connected to an external device through a leadframe. For instance, when performing the wire bonding, a ball bonding is performed over the metal pad. The bonding pad unit where the ball bonding is performed includes an insulation layer among a plurality of metal layers.

FIG. 1 is a cross-sectional view of a typical bonding pad.

FIG. 2 is microscopic pictures showing limitations generated when performing a typical wire bonding.

Referring to FIG. 1, a typical bonding pad includes first to third metal layers 11, 13 and 15. A first insulation layer 12 is formed between the first metal layer 11 and the second metal layer 15. A second insulation layer 14 is formed between the second metal layer 13 and the third metal layer 15. A passivation layer 16 is formed over the third metal layer 15 to expose a portion of the third metal layer 15 where the bonding is performed.

Referring to FIG. 2, when performing the wire bonding, the bonding pad, i.e., the third metal layer 15, may be peeled off and even the second insulation layer 14 may be peeled off together. That is, a pad peeling occurs. The pad peeling of the second insulation layer 14 is generated because of the third metal layer 15 being damaged when the passivation layer 16 for exposing the third metal layer 15 is etched to thereby decrease a thickness of the third metal layer 15. More specifically, the third metal layer 15 with the decreased thickness is not capable of standing against power or stress applied thereto during a subsequent wire bonding process. Thus, the third metal layer 15 is cracked to thereby cause the pad peeling. Furthermore, the crack in the third metal layer 15 is transmitted to the second insulation layer 14 to deteriorate the second insulation layer 14. As a result, the pad peeling grows even worse. The pad peeling causes a bonding failure to thereby drop throughput of the semiconductor devices.

SUMMARY OF THE INVENTION

Embodiments of the present invention are directed to providing a bonding pad for preventing pad peeling and a method for fabricating the same.

In accordance with at least a disclosed embodiment, there is provided a bonding pad including a conductive layer formed over an insulation layer, and a dummy pattern penetrating the insulation layer and stuck in the conductive layer, wherein a bonding process is performed.

In accordance with another disclosed embodiment there is provided a method for forming a bonding pad. The method includes forming a dummy pattern, forming an insulation layer to cover the dummy pattern, selectively etching the insulation layer to form a recess pattern protruding a portion of the dummy pattern from the insulation layer, and forming a conductive pattern where a bonding process is performed to cover the dummy pattern protruded from the insulation layer.

DESCRIPTION OF SPECIFIC EMBODIMENTS

Embodiments of the present invention relate to a bonding pad for prevented pad peeling and method for fabricating the same.

An embodiment of the present invention discloses a method for protecting a bonding pad from being peeled off when a wire bonding process is performed and power or stress is applied to the bonding pad. The embodiment may be applied to a memory pad formation process including a ball bonding performed on the bonding pad for packaging. The embodiment may also be applied to any other methods for preventing the pad peeling from occurring during a formation of a large pattern like the bonding pad.

In bonding pad including a plurality of metal layers and an insulation layer therebetween, a top metal layer and another metal layer below the top metal layer are formed in one body. Thus, it is possible to prevent the peeling of the bonding pad.

Figure 1:
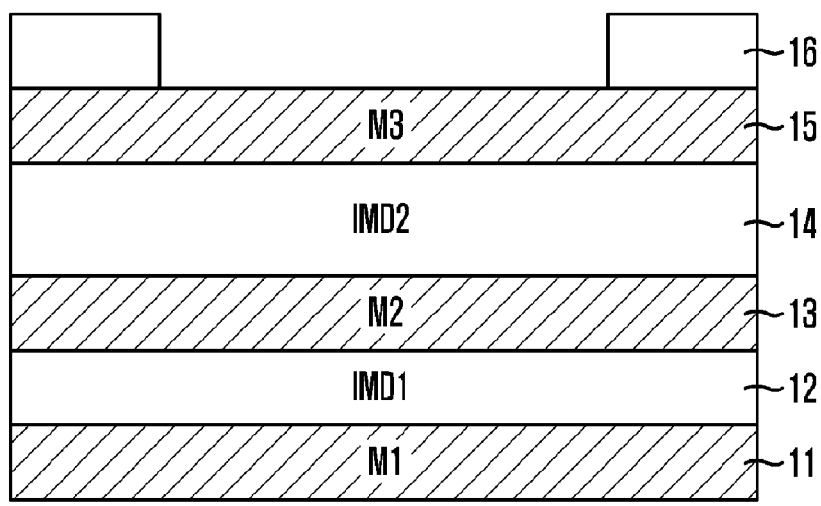
FIG. 1 is a cross-sectional view of a typical bonding pad.
Figure 2:
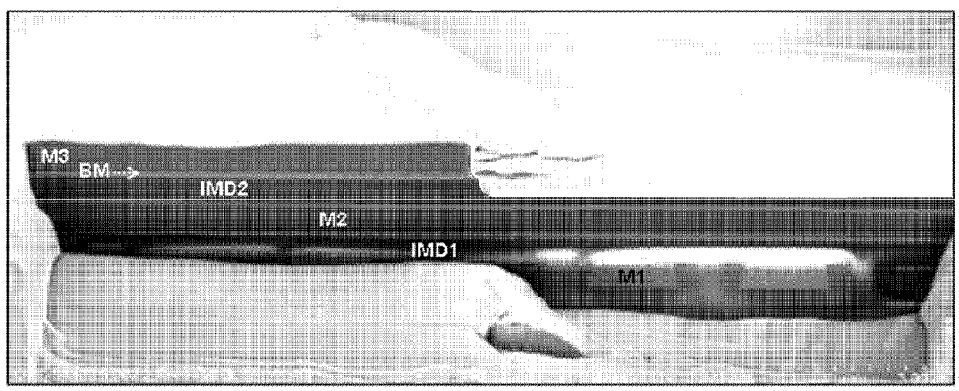
FIG. 2 is microscopic pictures showing limitations generated when performing a typical wire bonding.
Figure 3:
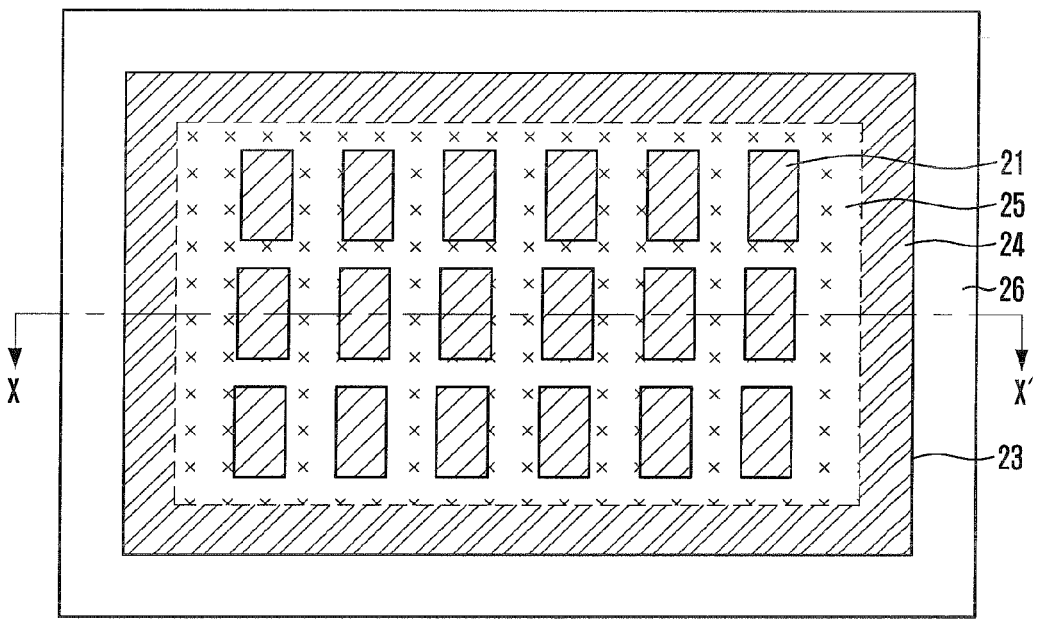
FIG. 3 is a plane view of a bonding pad in accordance with an embodiment of the present invention.

FIG. 3 is a plane view of a bonding pad in accordance with an embodiment of the present invention.

Figure 4:
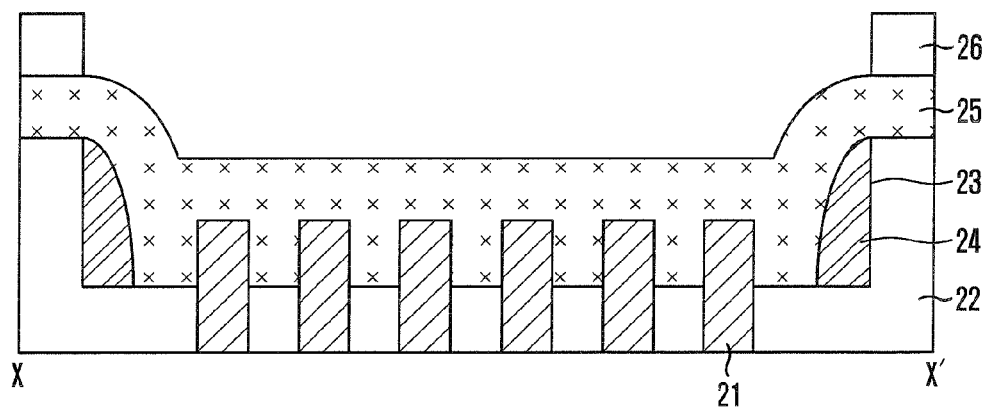
FIG. 4 is a cross-sectional view of the bonding pad of FIG. 3 cut along X-X' line.

FIG. 4 is a cross-sectional view of the bonding pad of FIG. 3 cut along X-X' line.

Referring to FIGS. 3 and 4, a bonding pad is formed over the insulation layer 22. The bonding pad includes a dummy pattern 21. The dummy pattern 21 penetrates the insulation layer 22 and is partly stuck in the conductive pattern 25. The insulation layer 22 may include a recess pattern 23. The recess pattern 23 may include a region where the conductive pattern 25 is in contact with the dummy pattern 21. Also, the bonding pad may include an adhesion layer 24 formed on sidewalls of the recess pattern 23 in a spacer shape. The adhesion layer 24 improves adhesion characteristics between the conductive pattern 25 and the insulation layer 22.

Herein, a portion of the dummy pattern 21 is stuck in a lower portion of the conductive pattern 25. The dummy pattern 21 penetrates and protrudes from the insulation layer 22. The conductive pattern 25, where the bonding is performed, covers the protruded dummy pattern 21. That is, the conductive pattern 25 for the bonding and the dummy pattern 21 are formed in one body to increase an adhesion power therebetween. Thus, the peeling of the bonding pad is prevented. To increase the adhesion power between the conductive pattern 25 and the dummy pattern 21, the dummy pattern 21 protrudes approximately 25% to approximately 75% of the vertical height of the dummy pattern above the surface of the insulation layer 22.

The dummy pattern 21 may be formed to have a plurality of slits arranged in a matrix form. By increasing a contact region between the conductive pattern 25 and the dummy pattern 21, adhesion power therebetween increases. Thus, the peeling of the bonding pad can be prevented.

The dummy pattern 21 penetrates the insulation layer 22 to protrude a portion thereof from the insulation layer 22. Thus, the adhesion area is reduced to effectively prevent the peeling of the bonding pad. An oxide layer, e.g., a Spin On Glass (SOG) layer for the insulation layer 22 below the bonding pad contains impurities such as carbon (C) so that hardness is low. Layer quality is easily lowered by power or stress applied on the bonding pad when the wire bonding is performed. Therefore, it is possible to maintain the layer quality of the insulation layer 22 and prevent the pad from being peeled off by reducing the adhesion between the conductive pattern 25 and the insulation layer 22.

Furthermore, the bonding pad may include a passivation layer 26 exposing a surface of the conductive pattern 25 in the bonding pad unit.

The conductive pattern 25, the dummy pattern 21, and the adhesion layer 24 may be selected from a group consisting of aluminum (Al) layer, a copper (Cu) layer, and a tungsten (W) layer. By preventing the pad peeling of the bonding pad, throughput of the package increases. As a result, production cost decreases.

In this embodiment, the bonding pad is applied to a Tri Layer Metallization (TLM) structure including first to third metal layer and an insulation layer formed among the metal layers.

FIGS. 5A to 5F are cross-sectional views describing a method for forming a bonding pad in accordance with an embodiment of the present invention.

Figure 5A:
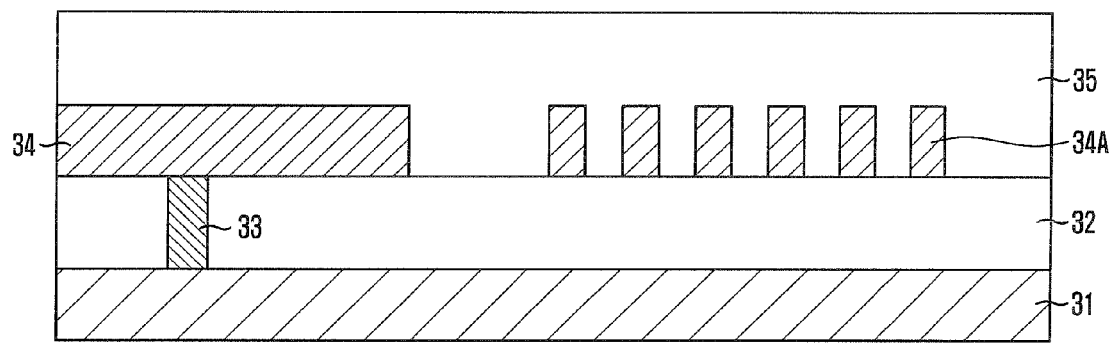
FIGS. 5A to 5F are cross-sectional views describing a method for forming a bonding pad in accordance with an embodiment of the present invention.

Referring to FIG. 5A, a first insulation layer 32 is formed over a first metal layer 31. The first metal layer 31 functions as a line and may be selected from the group consisting of Al layer, a Cu layer, and a W layer.

The first insulation layer 32 is an Inter Metal Dielectric (IMD) layer and may include an oxide layer. It is within the scope of the invention that the first insulation layer 32 may be a low-k layer. Thus, a parasitic capacitance between a second metal layer 34 and a dummy pattern 34A formed through a subsequent process is established.

The first insulation layer 32 is selectively etched to form a contact hole exposing an upper portion of the first metal layer 31. The contact hole is filled with a conductive layer to form a first plug 33 electrically connecting the first metal layer 31 to the second metal layer 34.

The second metal layer 34 is also formed over the first insulation layer. The second metal layer 34 is selectively etched to form a plurality of dummy patterns 34A. The second metal layer 34 functions as a line and may be selected from the group consisting of Al layer, a Cu layer, and a W layer.

Herein, the dummy pattern 34A does not function as a line. The dummy pattern 34A is formed to be electrically divided with the second metal layer 34. Furthermore, the dummy pattern 34A increases contact dimensions between a subsequent conductive pattern for the bonding process and the dummy pattern 34A to increase the adhesion power therebetween. Thus, the dummy pattern 34A is formed to have a plurality of slits arranged in a matrix form. It is also within the scope of the invention to form the dummy pattern 34A to have other various shapes that can increase the contact dimensions between the subsequent conductive pattern and the dummy pattern 34A.

A second insulation layer 35 is formed to cover the second metal layer 34 and the dummy pattern 34A. The second insulation layer 35 is an Inter Metal Dielectric layer (IMD) and may be an oxide layer. The second insulation layer 35 may be a low-k layer. Thus, parasitic capacitance between the second metal layer 34 and the dummy pattern 34A formed through a subsequent process is established.

Figure 5B:
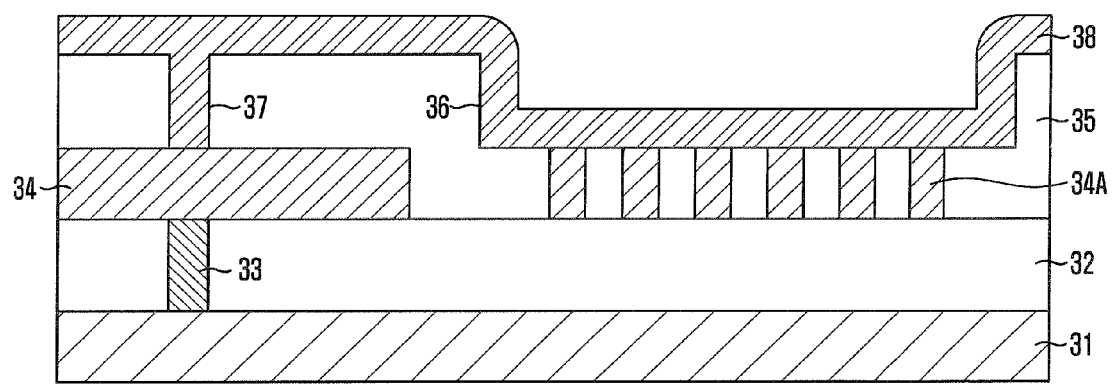

Referring to FIG. 5B, the second insulation layer 35 is selectively recess etched to form a recess pattern 36 exposing an upper surface of the dummy pattern 34A. When the recess pattern 34 is formed, a contact hole 37 exposing an upper surface of the second metal layer 34 can be simultaneously formed. The contact hole 37 forms a second plug electrically connecting a subsequent third metal layer and the second metal layer 34. A linewidth of the contact hole 37 is smaller than that of the recess pattern 36.

A conductive layer 38 for a plug is formed over the second insulation layer 35. The conductive layer 38 may be a metal layer such as a tungsten (W) layer. Since a linewidth of the recess pattern 36 is greater than that of the contact hole 37, the contact hole 37 is completely filled with the conductive layer 38. At the same time, the conductive layer 38 is formed along a surface of the recess pattern 36.

Figure 5C:
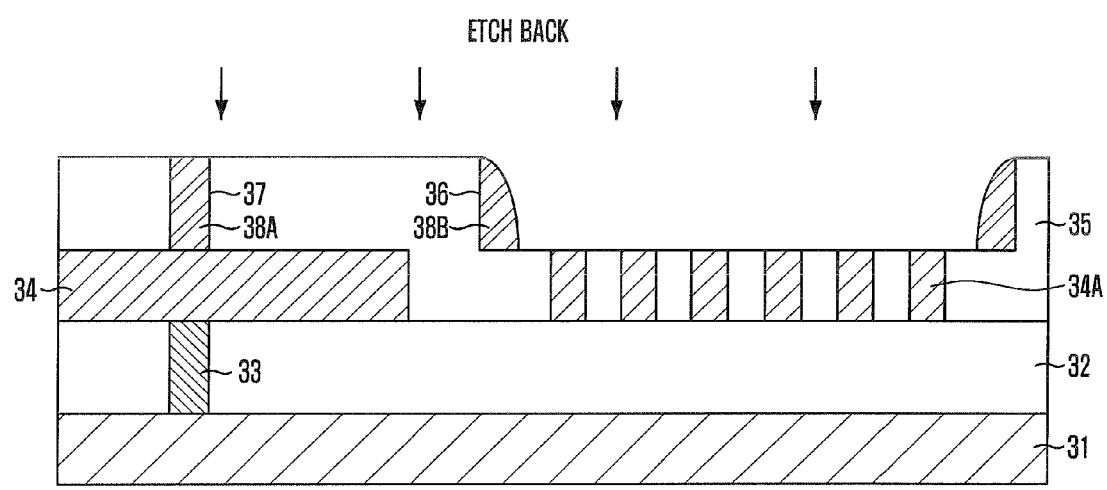

Referring to FIG. 5C, an etch-back process is performed to expose a surface of the second insulation layer 35. Thus, a second plug 38A is formed to fill the contact hole 37. An adhesion layer 38B is formed on a sidewall of the recess pattern 36 to have a spacer shape. The adhesion layer 38B can improve adhesion characteristics between the conductive pattern and the second insulation layer 35.

Figure 5D:
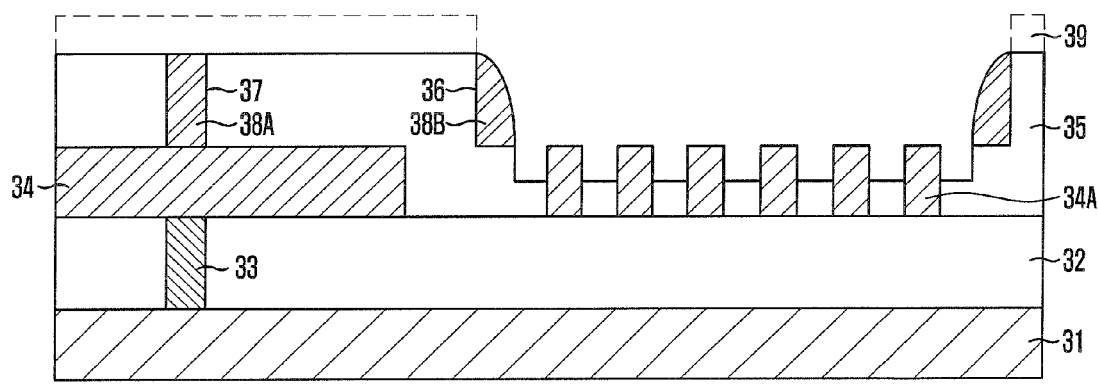

Referring to FIG. 5D, a photoresist pattern 39 is formed over the second insulation layer 35 to open the region where the recess pattern 36 is formed. The second insulation layer 35 is etched using the photoresist pattern 39 and the adhesion layer 38B as an etch barrier to protrude a portion of the dummy pattern 34A from the second insulation layer 35. The dummy pattern 34A protrudes approximately 25% to approximately 75% of the vertical height of the dummy pattern above the surface of the etched second insulation layer 35.

A portion of the dummy pattern 34A protrudes from the second insulation layer 35 to form a subsequent conductive pattern and the dummy pattern 34A in one body. A removal process is performed to remove the photoresist pattern 39.

Figure 5E:
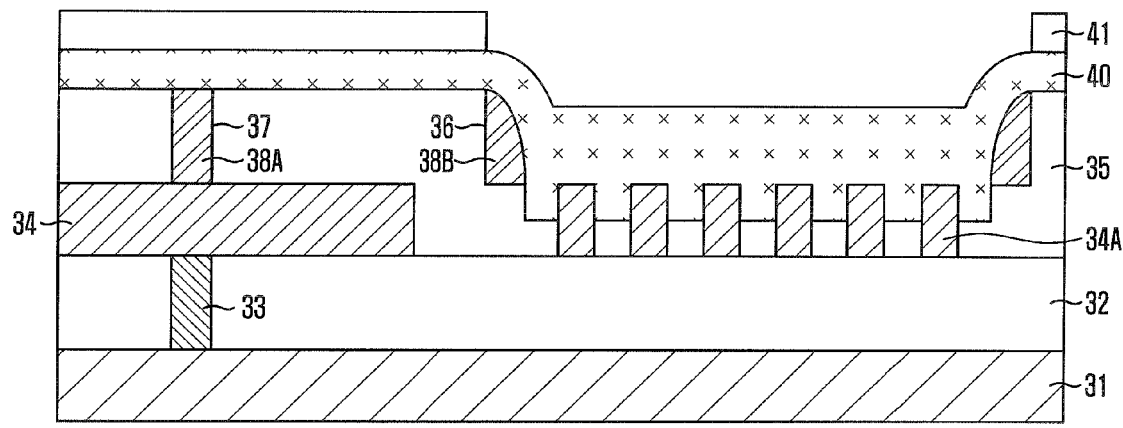

Referring to FIG. 5E, a third metal layer is formed over the second insulation layer 35 to cover the dummy pattern 34A. The third metal layer is selectively etched to form a conductive pattern 40 for the bonding process. The conductive pattern 40 may be selected from the group consisting of Al layer, a Cu layer, and a W layer. The conductive pattern simultaneously functions as a line and a bonding pad.

Since the conductive pattern 40 is formed to cover the protruded dummy pattern 34A, the contact region between the second insulation layer 35. An oxide layer, e.g., a spin on gas (SOG) layer for the second insulation layer 35 below the bonding pad contains impurities such as carbon (C) so that hardness is low. Layer quality is easily lowered by power or stress applied on the bonding pad when the wire bonding is performed. Therefore, it is possible to maintain the layer quality of the second insulation layer 35 and prevent the pad from being peeled off by reducing the adhesion between the conductive pattern 40 and the second insulation layer 35. A passivation layer 41 is formed over a resultant structure including the conductive pattern 40. The passivation layer 41 is selectively etched to expose the conductive pattern 40. Herein, the conductive pattern 40 may be damaged so that a thickness of the conductive pattern 40 may be reduced. When the thickness of the conductive pattern 40 is reduced, a crack may appear therein due to power or stress during a subsequent wire bonding process. However, in the bonding pad of as in the disclosed embodiments of the present invention, the conductive pattern 40 is formed to cover the protruded dummy pattern 34A. Thus, the thickness of the conductive pattern 40 may be high. That is, the bonding pad of the disclosed embodiments of the present invention may be thicker than the typical bonding pad. Even though a portion of the conductive pattern 40 is damaged during an etch of the passivation layer 41 for exposing the conductive pattern 40 in the bonding pad, the crack does not appear in the conductive pattern 40 by the power or the stress applied during the subsequent process.

Figure 5F:
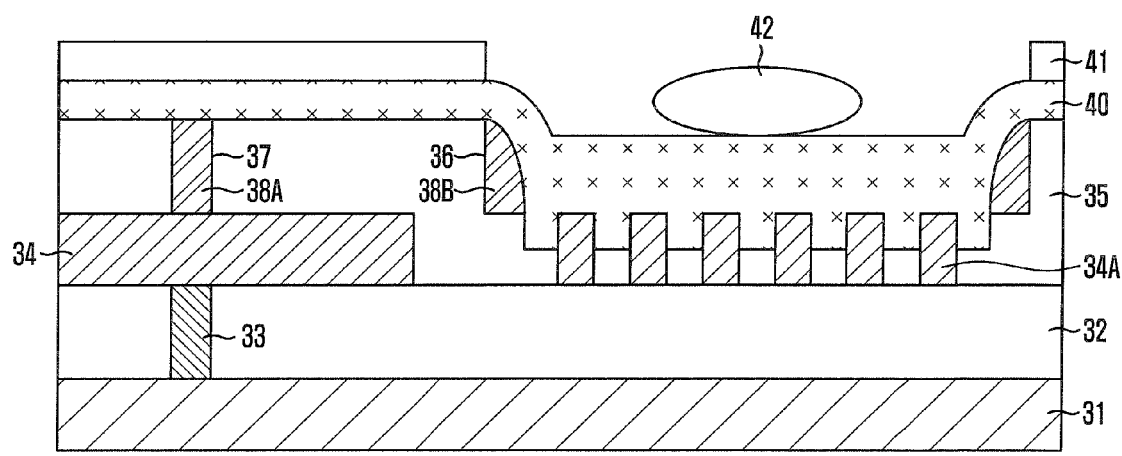

Referring to FIG. 5F, the wire bonding process is performed on the conductive pattern 40. The wire bonding may be a ball bonding 42 process. To increase the adhesion power between the conductive pattern 40 and the ball bonding 42, the power is applied in a perpendicular direction to the conductive pattern 40 or physical oscillation may be applied during the wire bonding process.

As described, the conductive pattern 40 and the dummy pattern 34A are formed in one body. Thus, it is possible to prevent the peeling of the bonding pad and increase a throughput of the package.

In the disclosed embodiments, the dummy pattern 34A protruding from the insulation layer 35 is formed to cover the conductive pattern 40 where the bonding process is performed. Since the dummy pattern 34A and the conductive pattern 40 are formed in one body, the peeling of the bonding pad can be prevented.

A portion of the dummy pattern 34A is protruded from the insulation layer 35 to reduce the contact dimensions between the insulation layer 35 and the conductive pattern 40. As a result, the peeling of the bonding pad can be prevented.

Also, the conductive pattern 40 is formed to cover the dummy pattern 34A protruding from the insulation layer 35. The thickness of the conductive pattern 40 increases and the crack is caused less in the conductive pattern 40 when the passivation layer 41 is etched to expose the conductive pattern 40. As a result, the peeling of the bonding pad can be prevented.

Furthermore, the adhesion layer 38B is formed to have a spacer shape to increase the adhesion force between the insulation layer 35 and the conductive pattern 40. Thus, it is possible to prevent the peeling of the bonding pad during the wire bonding process.

While the present invention has been described with respect to the disclosed embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for forming a bonding pad, comprising:
    forming dummy patterns;
    forming an insulation layer that covers the dummy patterns;
    selectively etching the insulation layer to form a recess pattern, wherein upper portions of the dummy patterns are protruded from the etched insulation layer, and wherein the etched insulation layer remains between lower portions of the dummy patterns; and
    forming a conductive pattern that covers the dummy patterns to fill spaces between the protruding upper portions of the dummy patterns to form the conductive pattern and the dummy patterns in direct physical contact, wherein the conductive pattern is later used in a bonding process.

2. The method of claim 1, further comprising forming an adhesion layer on sidewalls of the recess pattern.

3. The method of claim 2, wherein the adhesion layer is formed to have a spacer shape.

4. The method of claim 2, wherein each of the conductive pattern, the dummy patterns and the adhesion layer includes a metal layer.

5. The method of claim 2, wherein each of the conductive pattern, the dummy patterns and the adhesion layer includes one selected from a group consisting of an Al layer, a Cu layer, and a W layer.

6. The method of claim 1, wherein the dummy patterns are formed in a matrix shape, the matrix shape having a plurality of slits therein.

7. The method of claim 1, wherein the dummy patterns protrude approximately 25% to approximately 75% of a vertical height of the dummy patterns above the surface of the etched insulation layer disposed between the dummy patterns.

8. The method of claim 1, wherein a metal pattern functioning as a line is simultaneously formed when the dummy patterns are formed.

9. The method of claim 1, wherein the etched insulation layer remains to have flat plane between the lower portions of the dummy patterns.

10. The method of claim 1, further comprising:
    forming a conductive layer over the insulation layer;
    performing an etch-back process on the conductive layer to expose a surface of the insulation layer after forming the insulation layer; and
    forming a photoresist pattern over the insulation layer to open the region where the recess pattern is formed.

11. The method of claim 10, wherein the insulation layer is etched using the photoresist pattern and an adhesion layer as an etch barrier to protrude the upper portions of the dummy patterns from the insulation layer, wherein the adhesion layer is formed on side walls of the recess pattern.

12. A method for forming a bonding pad, comprising:
    forming a first insulation layer over a first metal layer;
    selectively etching the first insulation layer to form a contact hole exposing an upper portion of the first metal layer;
    filling the contact hole with a conductive layer to form a plug, which electrically connects the first metal layer;
    forming a second metal layer over the first insulation layer;
    selectively etching the second metal layer to form dummy patterns;
    forming a second insulation layer to cover the second metal layer and the dummy patterns;
    selectively etching the second insulation layer to form a recess pattern, wherein an upper portion of the dummy pattern is protruded from the etched second insulation layer, and the second etched insulation layer remains between a lower portion of the dummy patterns; and
    forming a conductive pattern that covers the dummy patterns to fill spaces between the protruding upper portion of the dummy patterns to form the conductive pattern and the dummy patterns in direct physical contact, wherein the conductive pattern is later used in a bonding process.

13. The method of claim 12, wherein the dummy patterns are electrically divided from a portion of the second metal layer that is over the plug.

14. The method of claim 12, wherein when the recess pattern is formed, a second contact hole is formed to expose an upper surface of the second metal layer.

15. The method of claim 12, wherein the etched second insulation layer remains to have flat plane between lower portions of the dummy patterns.

16. The method of claim 12, further comprising:
forming a third metal layer over the second insulation layer;
performing an etch-back process on the third metal layer to expose a surface of the second insulation layer after forming the second insulation layer; and
forming a photoresist pattern over the second insulation layer to open the region where the recess pattern is formed.

17. The method of claim 16, further comprising forming an adhesion layer on sidewalls of the recess pattern.

18. The method of claim 17, wherein the second insulation layer is etched using the photoresist pattern and the adhesion layer as an etch barrier to protrude the upper portions of the dummy patterns from the second insulation layer.

* * * * *